US005548891A

United States Patent [19]

Sakemi et al.

[11] Patent Number: 5,548,891

[45] Date of Patent: Aug. 27, 1996

[54] METHOD OF AUTOMATICALLY MOUNTING ELECTRONIC CONNECTOR ONTO AN END OF PRINTED CIRCUIT BOARD

[75] Inventors: Shoji Sakemi, Fukuoka; Teruaki Nishinaka, Kasuga, both of Japan

[73] Assignee: Matsushita Electric Industrial Co., Ltd., Osaka, Japan

[21] Appl. No.: 360,071

[22] Filed: Dec. 20, 1994

[30] Foreign Application Priority Data

Dec. 22, 1993 [JP] Japan .................................... 5-324631

[51] Int. Cl.$^{6}$ ............................... H05K 3/00; H01R 9/00

[52] U.S. Cl. ................................ 29/842; 29/759; 29/747; 29/33 M

[58] Field of Search ............................. 29/842, 844, 739, 29/759, 33 M, 747, 761; 439/69, 70, 59

[56] References Cited

U.S. PATENT DOCUMENTS

| | | | |
|---|---|---|---|
| 4,790,066 | 12/1988 | Sato | 29/759 X |
| 4,991,666 | 2/1991 | Septfons et al. | 439/79 X |
| 5,081,764 | 1/1992 | Utunomiya et al. | 29/842 X |
| 5,363,552 | 11/1994 | Coniff | 29/842 X |

FOREIGN PATENT DOCUMENTS

| | | | |
|---|---|---|---|
| 2424689 | 12/1979 | France | 29/842 |

*Primary Examiner*—Peter Vo
*Assistant Examiner*—Khan V. Nguyen
*Attorney, Agent, or Firm*—Pollock, Vande Sande & Priddy

[57] ABSTRACT

A connector 1 is provided with first leads 3—3 protruding forward from a front surface of a connector main body 2 so as to constitute a longer lead row, and second leads 4—4 shorter than the first leads 3—3 and protruding forward from the front surface of the connector main body 2 so as to constitute a shorter lead row. The longer lead row is parallel to and spaced in a vertical direction from the shorter lead row. The connector 1 is held with an installation head 6. The connector 1 is horizontally transported until the protruding distal ends of the first leads 3—3 are positioned just above an end (i.e. terminals 14—14) of a printed circuit board 11 while the protruding distal ends of the second leads 4—4 are offset from the end (i.e. terminals 15—15) of the printed circuit board 11. The connector 1 is vertically shifted until the protruding distal ends of the first leads 3—3 are brought into contact with terminals 14—14 provided on the end of the printed circuit board 11 while the second leads 4—4 are spaced from the printed circuit board 11. The connector 1 is advanced toward the printed circuit board 11 until the end of the printed circuit board 11 is clamped between the first and second leads 3—3 and 4—4, thereby mounting the connector onto an end of the printed circuit board.

15 Claims, 4 Drawing Sheets

METHOD OF AUTOMATICALLY MOUNTING ELECTRONIC CONNECTOR ONTO AN END OF PRINTED CIRCUIT BOARD

BACKGROUND OF THE INVENTION

1. Field of the Invention

The present invention relates to a connector for electrically connecting a printed circuit board with an external device, and more particularly to a method and an apparatus for automatically mounting the connector on an end portion of the printed circuit board.

2. Prior Art

In general, various electronic components or parts are mounted on a printed circuit board which is to be incorporated in various electronic apparatus. Among these electronic components or parts, connectors are characterized in that they are usually mounted on an end portion of a printed circuit board for realizing the required function of electrically connecting the printed circuit board to an external device.

A conventionally well-known connector comprises a connector main body made of synthetic resin mold, upper leads protruding in a row from an upper front of the connector main body, and lower leads protruding in a row from a lower front of the connector main body. Upper and lower leads are parallel to each other and a clearance space between these upper and lower leads is substantially identical with a thickness of an edge of the printed circuit board to be coupled with this connector.

Electronic components, such as a resistance chip, a capacitor chip and an IC, are generally mounted on a surface of the printed circuit board from the top of the printed circuit board using a surface mounting method or an insertion mounting method. An exclusive mounting equipment, such as an electronic component mounting device, is normally provided to mounting these electronic components onto the printed circuit board from the top of the printed circuit board.

On the other hand, a mounting operation for a connector is carried out from the side of the printed circuit board, since upper and lower leads of the connector are arranged to clamp the edge of the printed circuit board therebetween, as described above. Due to the difference of above-described mounting directions, the conventional electronic component mounting device could not be used for mounting the connectors. In other words, an automatic mounting operation of connectors was not realized. Thus, connectors are mounted by manual operation of workers.

As a matter of fact, the manual mounting of workers decreases productivity and requires much manpower.

SUMMARY OF THE INVENTION

Accordingly, in view of above-described problems encountered in the prior art, a principal object of the present invention is to provide a method of automatically mounting a connector on an end of a printed circuit board.

In order to accomplish this and other related objects, a first aspect of the present invention provides a method of mounting a connector on an end of a printed circuit board comprising the steps of: preparing a connector having first leads protruding forward from a front surface of a connector main body so as to constitute a longer lead row, and second leads shorter than the first leads and protruding forward from the front surface of the connector main body so as to constitute a shorter lead row, the longer lead row being parallel to the shorter lead row; positioning the connector at a position where a protruding distal end of the first lead is brought into contact with a surface of a printed circuit board but a protruding end of the second lead is spaced from the printed circuit board; and advancing the connector toward the printed circuit board until the end of the printed circuit board is clamped between the first and second leads.

In accordance with the above aspect of the present invention, the first leads protrude forward from the front surface of the connector main body so as to constitute the longer lead row, while the second leads shorter than the first leads protrude forward from the front surface of the connector main body so as to constitute the shorter lead row. Thus, the longer lead row is utilized to position the connector to a predetermined place when the connector is installed onto an edge of the printed circuit board, thereby facilitating an installation of a connector onto an edge of the printed circuit board.

In the above first aspect of the present invention, it is preferable that the connector is advanced from a side of the printed circuit, so the first and second leads are positioned in parallel with the printed circuit board. Furthermore, it is preferable that the connector is shifted vertically when the connector is positioned, while the connector is shifted horizontally when the connector is advanced toward the printed circuit board.

A second aspect of the present invention provides a method of mounting a connector on an end of a printed circuit board comprising steps of: preparing a connector having first leads protruding forward from a front surface of a connector main body so as to constitute a longer lead row, and second leads shorter than the first leads and protruding forward from the front surface of the connector main body so as to constitute a shorter lead row, the longer lead row being parallel to the shorter lead row; shifting the connector to a first predetermined position close to but spaced from a printed circuit board; shifting the connector to a second predetermined position where a protruding distal end of the first lead is brought into contact with a surface of the printed circuit board but a protruding end of the second lead is spaced from the printed circuit board; and advancing the connector toward the printed circuit board until the end of the printed circuit board is clamped between the first and second leads.

In the above second aspect of the present invention, it is preferable that the connector is shifted in one direction when the connector is moved from the first predetermined position to the second predetermined position, while the connector is shifted in another direction when the connector is advanced toward the printed circuit board. More specifically, the one direction is a vertical direction and the another direction is a horizontal direction.

A third aspect of the present invention provides a method of mounting a connector on an end of a printed circuit board comprising steps of: preparing a connector having first leads protruding forward from a front surface of a connector main body so as to constitute a longer lead row, and second leads shorter than the first leads and protruding forward from the front surface of the connector main body so as to constitute a shorter lead row, the longer lead row being parallel to and spaced in a vertical direction from the shorter lead row; holding the connector with an installation head; transporting the connector until protruding distal ends of the first leads are positioned above a surface of a printed circuit board;

shifting the connector until the protruding distal ends of the first leads are brought into contact with terminals provided on the end of the printed circuit board; and advancing the connector toward the printed circuit board until the end of the printed circuit board is clamped between the first and second leads.

A fourth aspect of the present invention provides a method of mounting a connector on an end of a printed circuit board comprising steps of: preparing a connector having first leads protruding forward from a front surface of a connector main body so as to constitute a longer lead row, and second leads shorter than the first leads and protruding forward from the front surface of the connector main body so as to constitute a shorter lead row, the longer lead row being parallel to and spaced in a vertical direction from the shorter lead row; holding the connector with an installation head; horizontally transporting the connector until protruding distal ends of the first leads are positioned above a surface of a printed circuit board but protruding distal ends of the second leads are offset from the end of the printed circuit board; vertically shifting the connector until the protruding distal ends of the first leads are brought into contact with terminals provided on the end of the printed circuit board while the second leads are spaced from the printed circuit board; and advancing the connector toward the printed circuit board until the end of the printed circuit board is clamped between the first and second leads.

In this fourth aspect of the present invention, it is preferable that the connector is held by the installation head in such a manner that the first leads constitute a horizontally extending longer lead row and the second leads constitute a horizontally extending shorter lead row, the longer lead row being spaced from the shorter lead row in a vertical direction. Also, a clearance space between the longer lead row and the shorter lead row corresponds to a thickness of the edge of the printed circuit board.

According to the above second to fourth aspects of the present invention, an effect similar to that of the first aspect is obtained.

A fifth aspect of the present invention provides a method of mounting a connector on an end of a printed circuit board comprising steps of: preparing a connector having first leads protruding forward from a front surface of a connector main body so as to constitute a longer lead row, and second leads shorter than the first leads and protruding forward from the front surface of the connector main body so as to constitute a shorter lead row, the longer lead row being parallel to the shorter lead row; positioning the connector at a position where protruding distal ends of the first leads are brought into contact with an end of a printed circuit board but protruding ends of the second leads are spaced from the printed circuit board; causing deflection of the first leads in such a manner that a clearance space between the longer lead row and the shorter lead row is increased; and advancing the connector toward the printed circuit board until the end of the printed circuit board is clamped between the first and second leads.

According to this fifth aspect of the present invention, elasticity of the first lead is utilized to expand the clearance between the first lead and its corresponding second lead. Therefore, the installation of the first and second leads onto an end of the printed circuit board is surely and easily executed, since the enlarged clearance space can absorb the unevenness of each thickness of the printed circuit board.

In the above fifth aspect of the present invention, it is preferable that the connector is advanced from a side of the printed circuit, or the connector is shifted vertically when the connector is positioned, while the connector is shifted horizontally when the connector is advanced toward the printed circuit board.

A sixth aspect of the present invention provides a method of mounting a connector onto an end of a printed circuit board comprising steps of: preparing a connector having first leads protruding forward from a front surface of a connector main body so as to constitute a longer lead row, and second leads shorter than the first leads and protruding forward from the front surface of the connector main body so as to constitute a shorter lead row, the longer lead row being parallel to the shorter lead row; shifting the connector to a first predetermined position close to but spaced from a printed circuit board; shifting the connector to a second predetermined position where a protruding distal end of the first lead is brought into contact with a surface the printed circuit board but a protruding end of the second lead is spaced from the printed circuit board, the protruding distal end of the first lead causing a deflection in this second predetermined position so as to increase a clearance space between the longer lead row and the shorter lead row; and advancing the connector toward the printed circuit board until the end of the printed circuit board is clamped between the first and second leads.

According to the sixth aspect of the present invention an effect similar to the fifth aspect is obtained.

Furthermore, a seventh aspect of the present invention provides a connector mounting apparatus comprising: a shift table for shifting an installation head in a first direction; a nozzle shaft associated with the installation head and extendable in a second direction; a nozzle fixed to an end of the nozzle shaft, the nozzle having an upper wall portion and a back wall portion, the back wall portion having a surface normal to the first direction and the upper wall portion having a surface normal to the second surface, thereby supporting two surfaces of a connector when the connector is installed on an end of a printed circuit board.

In the seventh aspect of the present invention, it is preferable that the first direction is a horizontal direction and the second direction is a vertical direction. The upper wall portion has a horizontally extending lower surface at the bottom thereof which is brought into contact with an upper wall of the connector when the connector is installed on an end of the printed circuit board. The back wall portion protrudes from one edge of the upper wall portion and has a vertically extending surface to be brought into contact with a back wall of the connector when the connector is installed on an end of the printed circuit board. And, the nozzle includes a suction hole formed therein for absorbing the connector by vacuum.

An eighth aspect of the present invention provides a connector mounting apparatus comprising: a nozzle having a flat surface for holding a connector; and pressing means for pressing a back wall of the connector to couple the connector with an end of a printed circuit board from a side of the printed circuit board in a direction parallel to a main surface of the circuit board.

In the eighth aspect, it will be preferable that the pressing means includes a pin pushing the back wall of the connector, a nut supporting the pin, a feed screw horizontally extending and screwed into the nut, and a guide shaft extending parallel to and above the feed screw for guiding the nut.

And, a ninth aspect of the present invention provides a connector mounting apparatus comprising: an installation head including a head main body and a pair of chuck claws protruding horizontally from a front surface of the head main body; a pad provided on an inside surface of each chuck claw, so that the pad is interposed between a corresponding chuck claw and a connector when the connector is clamped between the chuck claws; and means for coupling the connector clamped between the chuck claws with an end of a printed circuit board.

In the ninth aspect, it will be preferable that a clearance between the chuck claws is variable in accordance with a width of the connector.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENTS

Figure 1:
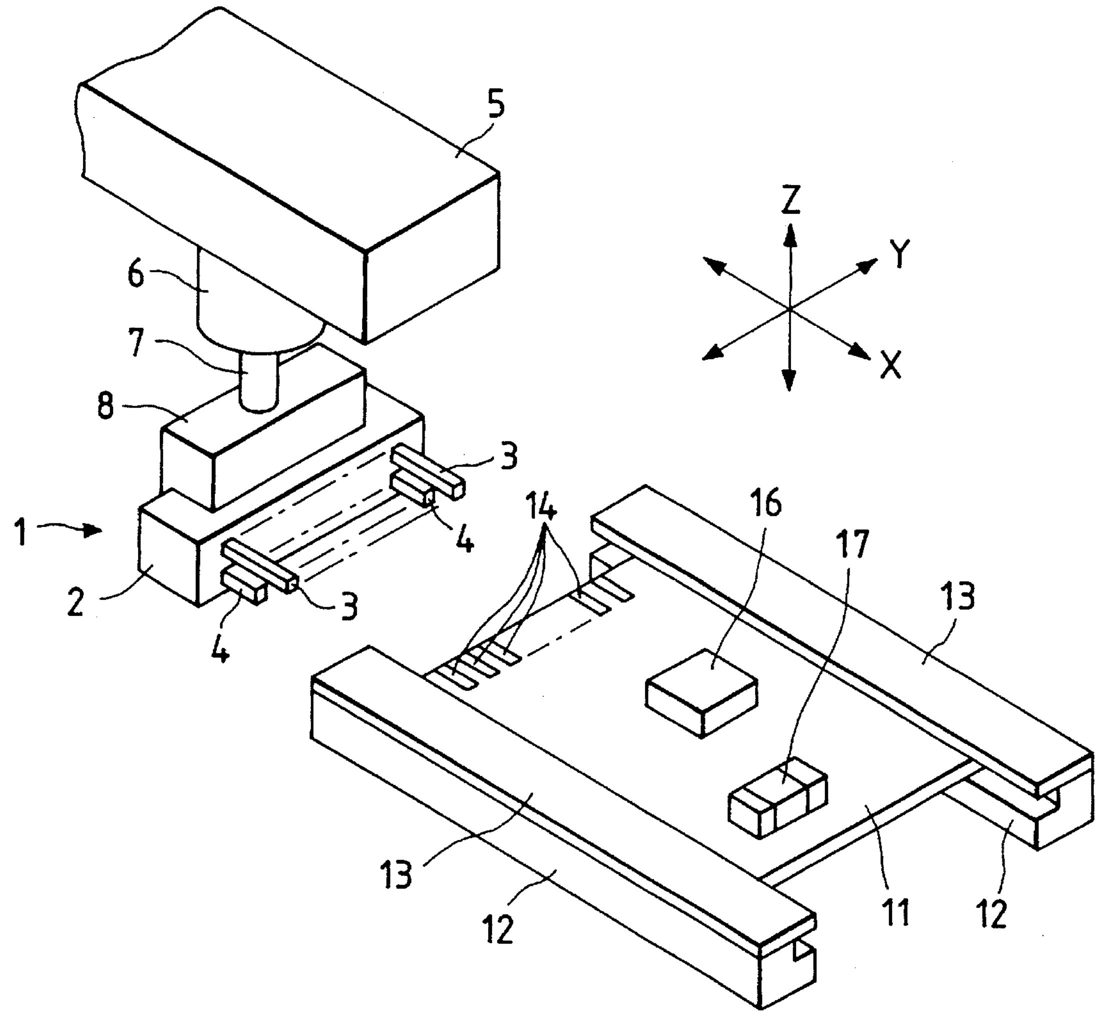
FIG. 1 is a perspective view showing an essential arrangement of a connector mounting apparatus in accordance with a first embodiment of the present invention.

Preferred embodiments of the method of mounting a connector onto the printed circuit board in accordance with the present invention will be explained in greater detail hereinafter, with reference to the accompanying drawings wherein the same reference numerals are applied to like parts. FIG. 1 is a perspective view showing an essential arrangement of a connector mounting apparatus in accordance with the first embodiment of the present invention. A connector 1 comprises a connector main body 2 made of synthetic resin mold. The connector main body 2 has a front surface on which first leads 3—3 and second leads 4—4 are provided. The first leads 3—3 protrude forward at regular intervals from the upper front of the connector main body 2 so as to constitute an upper lead row, while the second leads 4—4 protrude forward at regular intervals or pitches from the lower front of the connector main body 2 so as to constitute a lower lead row. More specifically, the first leads 3—3 and the second leads 4—4 are disposed in parallel with each other, so that a clearance space between the upper lead row and the lower lead row is substantially identical with a thickness of an edge of a printed circuit board to be coupled or engaged with this connector 1. The first lead 3 is longer than the second lead 4. Thus, the protruding distal end of each first lead 3 is positioned farther away from the front surface of the connector main body 2 than that of each second lead 4.

A reference numeral 5 represents a shift table having an installation head 6 provided on a front lower surface thereof. The installation head 6 has a nozzle shaft 7 supporting a nozzle 8 at a lower end thereof. A vacuum suction device (not shown) is incorporated in the nozzle 8 to absorb the connector main body 2. When the shift table 5 is driven, the installation head 6 causes a horizontal shift movement in an X direction or a Y direction. The nozzle 8 causes a vertical shift movement when either the installation head 6 or the nozzle shaft 7 moves in a Z direction.

Figure 2A:
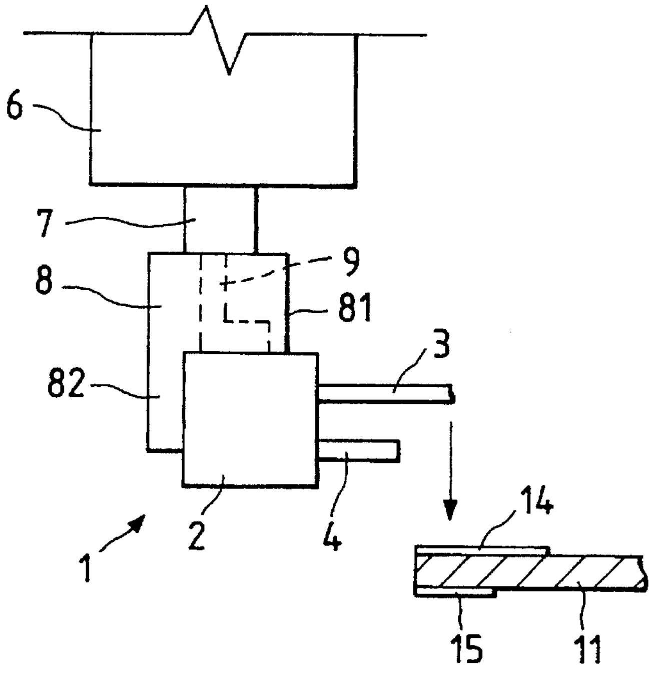
FIGS. 2A through 2C are side views essentially illustrating a series of steps of mounting a connector on an edge of a printed circuit board using the connector mounting apparatus in accordance with the first embodiment of the present invention.
Figure 2B:
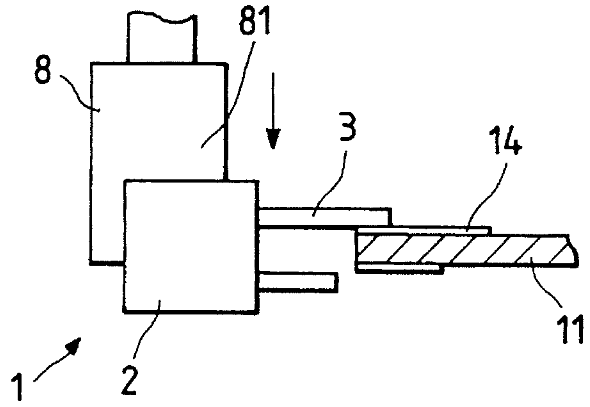
Figure 2C:
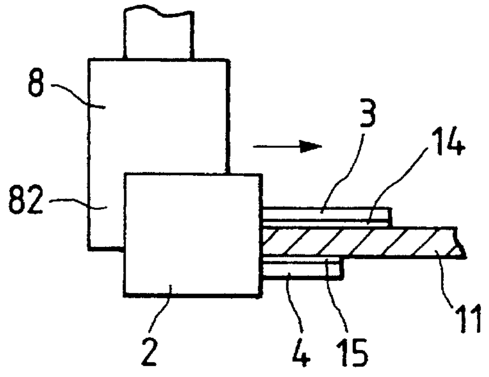

FIGS. 2A through 2C are side views essentially illustrating a series of steps of mounting a connector on an edge of a printed circuit board using the connector mounting apparatus in accordance with the first embodiment of the present invention. In FIG. 2A, the nozzle 8, having a reversed L shape when seen from the side, comprises an upper wall portion 81 and a back wall portion 82. The upper wall portion 81 has a horizontally extending lower surface at the bottom thereof. This horizontally extending lower surface is brought into contact with the upper wall of the connector main body 2. The back wall portion 82, protruding downward from one lower edge of the upper wall portion 81, has a vertically extending surface to be brought into contact with the back wall of the connector main body 2.

Furthermore, a suction hole 9 is provided in the nozzle 8 (i.e. the upper wall portion 81) to absorb the connector main body 2 by vacuum. Forming the nozzle 8 into a reversed L shape consisting of the upper wall portion 81 and the back wall portion 82 is advantageous in firmly holding the connector main body 2 from two directions perpendicular to each other. Especially, the back wall portion 82 causes a pushing force acting on the semiconductor main body 2 from the back side thereof so that the first leads 3—3 and the second leads 4—4 are easily installed on or coupled with the edge of the printed circuit board as described later.

In accordance with this embodiment, the shift table 5 is provided for shifting the installation head 6 in a first direction. The nozzle shaft 7 is associated with the installation head 8 so as to be extendable in a second direction. The nozzle 8 is fixed to an end of the nozzle shaft 7. The nozzle 8 has the upper wall portion 81 and the back wall portion 82. The back wall portion 82 has a surface normal to the first direction and the upper wall portion 81 has a surface normal to the second surface, thereby supporting two surfaces of the connector main body 2 when the connector 1 is installed on an end of the printed circuit board 11.

Returning FIG. 1, a reference numeral 11 represents a printed circuit board to be coupled or engaged with the connector 1. The printed circuit board 11 has parallel long sides clamped by a pair of supports 12, 12. A reference numeral 13 represents a cover guide associated with the support 12. The printed circuit board 11 has other sides (i.e. short sides) at edges thereof in a longitudinal direction. On the upper surface of the edge of the printed circuit board (i.e. along one short side of the printed circuit board), a plurality of first terminals 14—14 are disposed in parallel with each other at regular intervals or pitches so as to constitute a first terminal row. In the same manner, on the lower surface of the same edge of the printed circuit board, a plurality of second terminals 15—15 are disposed in parallel with each other at regular intervals or pitches so as to constitute a second terminal row. (Refer to FIG. 2A) In other words, the first leads 3—3 are connected to their corresponding first terminals 14—14, and the second leads 4—4 are connected to their corresponding second terminals 15—15. Solder is coated beforehand on each upper surface of the first terminals 14—14 and the second terminals 15—15. Reference numerals 16 and 17 represent other electronic components or parts mounted on the printed circuit board 11.

Next, the method of mounting the connector 1 on the end of the printed circuit board 11 will be explained. FIGS. 2A–2C shows sequential steps of the mounting method. First of all, in response to actuation of the shift table 5, the installation head 6 moves horizontally until it reaches a feeder (not shown) in FIG. 1. Then, the nozzle 8 causes a vertical movement to pick up the connector 1 placed in the feeder using suction vacuum. Next, the installation head 6 moves horizontally until it reaches a point just above the edge of the printed circuit board 11 as shown in FIG. 2A. More specifically, the shift table 5 adjusts the position of the first leads 3—3 in such a manner that a protruding distal end of each first lead 3 is located just above a corresponding first terminal 14 provided on the edge of the printed circuit board 11. Meanwhile, the second leads 4—4 are positioned in such a manner that a protruding distal end of each second lead 4 does not interfere with the printed circuit board 11 when it is shifted in the vertical direction. In other words, the second leads 4—4 are offset from the printed circuit board 11. In this condition, first and second leads are positioned in parallel with the main surface of the printed circuit board 11. Such a positioning operation is carried out, for example, using a measuring device, such as a camera or laser equipment, which observes each position of the first terminals 14—14 or the second terminals 15—15 of the printed circuit board 11 and the first leads 3—3 or the second leads 4—4 of the connector 1. Each position data measured is supplied to a computer of the shift table 5 for realizing a position feedback control of the shift table 5.

Next, the nozzle 8 is lowered downward until the protruding distal end of each first lead 3 is brought into contact with its corresponding first terminal 14, as shown in FIG. 2B. However, the protruding distal end of each second lead 4 is not brought into contact with its corresponding second terminal 15. Namely, the second leads 4—4 are spaced from the printed circuit board 11 at this moment. In this case, the upper wall of the connector main body 2 is brought into contact with the upper wall portion 81 of the nozzle 8. This is effective to firmly push the first lead 3 against its corresponding first terminal 14.

Subsequently, as shown in FIG. 2C, the first leads 3—3 and the second leads 4—4 are coupled or engaged with the end of the printed circuit board 11 so as to clamp the end of the printed circuit board 11 between the upper lead row and the lower lead row of the connector 1. In this insertion operation, the back wall of the connector main body 2 is brought into contact with the back wall portion 82 of the nozzle 8. Thus, the coupling of the first leads 3—3 and the second leads 4—4 with the end of the printed circuit board 11 is surely accomplished by simply pushing the back wall of the connector main body 2 using the back wall portion 82 of the nozzle 8.

After finishing the installation of the connector 1 onto the edge of the printed circuit board 11, the suction vacuum is stopped to release the nozzle 8 from the connector main body 2. Then, the released nozzle 8 shifts upward and a series of installation steps is terminated. Thereafter, the printed circuit board 11 is transported to a reflow device to solder the first and second leads 3—3, 4—4 with the first and second terminals 14—14, 15—15, respectively.

Figure 3:
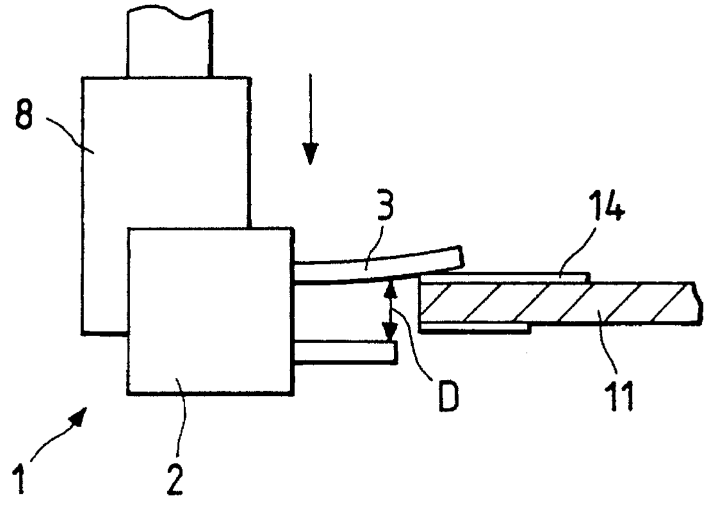
FIG. 3 is a side view essentially illustrating another method of mounting a connector on an edge of a printed circuit board using the connector mounting apparatus in accordance with the first embodiment of the present invention.

FIG. 3 is a side view essentially illustrating another method of mounting a connector on an edge of a printed circuit board using the connector mounting apparatus in accordance with the first embodiment of the present invention. FIG. 3 shows a condition corresponding to FIG. 2B. This method is similar to the above-described method except that the connector 1 is lowered so excessively that the first lead 3 is deflected upward after landing on its corresponding first terminal 14. Thus, a clearance space D between the first lead 3 and its confronting second lead 4 is enlarged as shown in FIG. 3. Thus, the connector 1 is shifted toward the printed circuit board 11 to couple or engage the first leads 3—3 and the second leads 4—4 with the end of the printed circuit board 11 in the same manner as in the previously explained method with reference to FIG. 2C. After finishing the installation of the connector 1 onto the edge of the printed circuit board 11, the suction vacuum is stopped to release the nozzle 8 from the connector main body 2. Then, the released nozzle 8 shifts upward and a series of installation steps is terminated. Utilizing elasticity of the first lead 3 in this manner to expand the clearance D between the first lead 3 and its corresponding second lead 4 is effective to assure and facilitate the installation of the first and second leads 3—3 and 4—4 onto the end of the printed circuit board 11, since the enlarged clearance space D can absorb the unevenness of each printed circuit board 11 in thickness.

Figure 4:
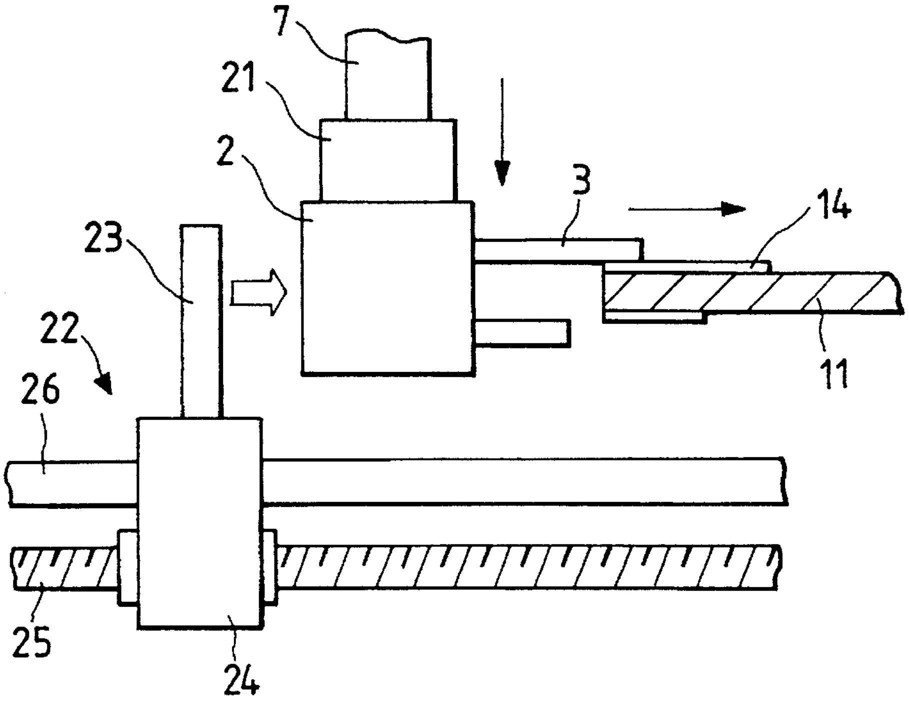
FIG. 4 is a side view essentially illustrating a method of mounting a connector on an edge of a printed circuit board using a connector mounting apparatus in accordance with a second embodiment of the present invention.

FIG. 4 is a side view essentially illustrating a method of mounting a connector on an edge of a printed circuit board using a connector mounting apparatus in accordance with a second embodiment of the present invention.

A reference numeral 21 represents a flat nozzle having a flat surface on the bottom thereof. This flat nozzle 21 holds the upper surface of the connector main body 2 by absorbing it using a suction vacuum. A reference numeral 22 represents a pressing means for pressing the back wall of the connector main body 2. The pressing means 22 comprises a pin 23 extending upward, a nut 24 supporting the pin 23, a feed screw 25 horizontally extending and screwed into the nut 24, and a guide shaft 26 extending in parallel with and above the feed screw 25 for guiding the nut 24. Namely, according to this embodiment, the nozzle 21 having a flat surface is provided for holding the connector main body 21. The pressing means 22 is provided for pressing the back wall of the connector main body 2 to couple the connector 1 with an end of the printed circuit board 11 from a side of the printed circuit board 11 in a direction parallel to a main surface of the circuit board 11.

As shown in FIG. 4, first of all, a protruding distal end of the first lead 3 is placed on the corresponding first terminal 14. Then, the connector 1 is moved toward the printed circuit board 11. More specifically, when a motor (not shown) rotates the feed screw 25, the nut 24 advances right (i.e. toward the printed circuit board 11) along the feed screw 25 and the guide shaft 26. Thus, the pin 23 pushes the back wall of the connector main body 2 until the first leads 3—3 and the second leads 4—4 are coupled or engaged with the end of the printed circuit board 11, thereby clamping the end of the printed circuit board 11 between the first and second leads 3—3 and 4—4.

Figure 5:
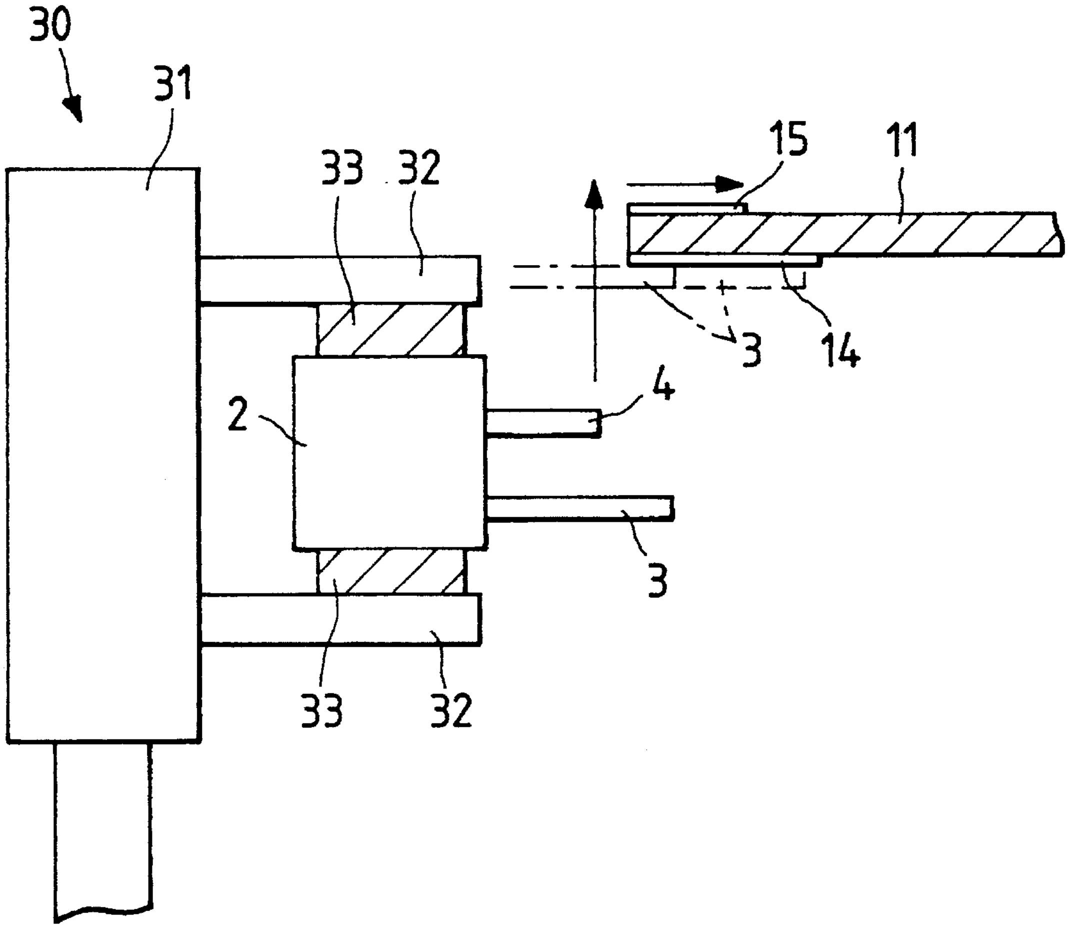
FIG. 5 is a side view essentially illustrating a method of mounting a connector on an edge of a printed circuit board using a connector mounting apparatus in accordance with a third embodiment of the present invention.

FIG. 5 is a side view essentially illustrating a method of mounting a connector on an edge of a printed circuit board using a connector mounting apparatus in accordance with a third embodiment of the present invention. A reference numeral 30 represents an installation head which comprises a head main body 31 and a pair of chuck claws 32 protruding horizontally in a forward direction from the front surface of head main body 31. A pad 33 is provided on the inside surface of each chuck claw 32. Namely, each pad 33 is interposed between the corresponding chuck claw 32 and the connector main body 2 when the connector main body 2 is clamped between the chuck claws 32, 32. The head main body 31 accommodates a cylinder (not shown) for moving either or both of the chuck claws 32 and 32 in the vertical direction, so that the clearance between the paired chuck claws 32 and 32 is flexibly increased or decreased in accordance with the width of the connector main body 2. According to this third embodiment, first leads 3—3 and second leads 4—4 of the connector 1 and first terminals 14—14 and second terminals 15—15 of the printed circuit board 11 are positioned in opposed relation to the layout of the first leads 3—3 and the second leads 4—4 and the first terminals 14—14 and the second terminals 15—15 of the first and second embodiments. The installation head 30 is supported by a shift table similar to that of the first embodiment. With this shift table, the connector 1 (i.e. connector main body 2) is advanced toward the printed circuit board 11 to couple or engage the connector 1 with an end of the printed circuit board 11.

That is to say, this embodiment provides the installation head 30 including the head main body 31 and paired chuck claws 32, 32 protruding horizontally from the front surface of the head main body 31. The pad 33 is also provided on the inside surface of each chuck claw 32, so that the pad 33 is interposed between a corresponding chuck claw 32 and the connector main body 2 when the connector 1 is clamped between the chuck claws 32, 32. Furthermore, there is provided the means for coupling or engaging the connector 1 clamped between the chuck claws 32, 32 with an end of the printed circuit board 11.

Next, an operation of the third embodiment will be explained. As shown in the drawing, the shift table is driven to place a protruding distal end of the first lead 3 just below a corresponding first terminal 14. Then, the connector 1 is lifted upward so that the protruding distal end of the first lead 3 is brought into contact with the first terminal 3 while the second lead 4 is spaced from the printed circuit board 11 (Refer to an alternate long and short dash line). Next, the connector 1 is moved toward the printed circuit board 11 until the first lead 3 and the second lead 4 are coupled or engaged with the end of the printed circuit board 11 (Refer to a broken line). Next, the chuck claws 32 and 32 are released and the installation head 30 is returned to its original position to end a series of installation steps. Next, the printed circuit board 11 is transported to a reflow device to solder the first and second leads 3 and 4 with the first and second terminals 14 and 15, respectively.

As described above, the present invention can be realized by various mounting methods. Utilizing elasticity of the first lead 3 to expand the clearance space D between the first lead 3 and its corresponding second lead 4 is of course employed in the second or third embodiment in the same manner as in the first embodiment. Although the position of connector 1 is adjusted with respect to the stationary printed circuit board 11 in the above-described embodiments, it is needless to say that the connector 1 can be fixed stationarily when the printed circuit board 11 is movable with respect to the stationary connector 1. Furthermore, the leads to be brought into contact with the terminals on the printed circuit board may comprise a dummy lead.

As apparent from the foregoing description, the connector mounting method of the present invention realizes an automatic mounting operation for coupling or engaging a connector with an edge of a printed circuit board by utilizing first and second leads protruding forward and having a length different from each other.

As this invention may be embodied in several forms without departing from the spirit of essential characteristics thereof, the present embodiment as described is therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A method of automatically mounting a connector on an end of a printed circuit board comprising the steps of:

preparing a connector having first leads protruding forward from a front surface of a connector main body, and second leads shorter than said first leads and protruding forward from the front surface of said connector main body, said first leads being parallel to said second leads to define a space for receiving an end portion of a printed circuit board;

positioning said connector in a holding means at a position where a protruding distal end of the first lead is brought into contact with a surface of a printed circuit board at said end portion but a protruding end of the second lead is spaced from said end portion of the printed circuit board; and advancing said holding means supporting said connector toward said printed circuit board until said end of the printed circuit board is clamped between said first and second leads.

2. The connector mounting method in accordance with claim 1, wherein said connector is advanced from a side of said printed circuit.

3. The connector mounting method in accordance with claim 1, wherein said first and second leads are positioned in parallel with said printed circuit board.

4. The connector mounting method in accordance with claim 1, wherein said connector is shifted perpendicularly to said printed circuit board when said connector is positioned, while said connector is shifted in a direction parallel to said circuit board when said connector is advanced toward the printed circuit board.

5. A method of automatically mounting a connector on an end of a printed circuit board comprising the steps of:

preparing a connector having first leads protruding forward from a front surface of a connector main body, and second leads shorter than said first leads and protruding forward from the front surface of said connector main body, said first leads being parallel to said second leads to define a space for receiving an end portion of a printed circuit board;

shifting said connector supported in a holding means to a first predetermined position adjacent to but spaced from a printed circuit board;

shifting said connector to a second predetermined position so that a protruding distal end of the first lead is brought into contact with a first surface of the printed circuit board at said end portion, and a protruding end of the second lead is spaced from the printed circuit board; and advancing said connector by advancing means coupled to said holding means toward said printed circuit board until said end of the printed circuit board is clamped between said first and second leads.

6. The connector mounting method in accordance with claim 5, wherein said connector is shifted in one direction when said connector is moved from said first predetermined position to said second predetermined position, while said connector is shifted in another direction perpendicular to said one direction when said connector is advanced toward said printed circuit board.

7. The connector mounting method in accordance with claim 6, wherein said one direction is a vertical direction and said another direction is a horizontal direction.

8. A method of automatically mounting a connector on an end of a printed circuit board comprising the steps of:

preparing a connector having first leads protruding forward from a front surface of a connector main body, and second leads shorter than said first leads and protruding forward from the front surface of said connector main body, said first leads being parallel to and spaced from said second leads defining a space for receiving an end portion of a printed circuit board;

holding said connector with an installation head;

transporting said connector until protruding distal ends of said first leads are positioned above a surface of the printed circuit board at said end portion;

shifting said connector until said protruding distal ends of the first leads are brought into contact with terminals provided on a surface of the printed circuit board at said end portion; and advancing said connector toward said printed circuit board until said printed circuit board is clamped between said first and second leads.

9. A method of automatically mounting a connector on an end of a printed circuit board comprising the steps of:

preparing a connector having first leads protruding forward from a front surface of a connector main body, and second leads shorter than said first leads and protruding forward from the front surface of said connector main body, said first leads being parallel to and spaced from said second leads defining a space for receiving an end portion of a printed circuit board;

holding said connector with an installation head;

horizontally transporting said connector until protruding distal ends of said first leads are positioned above a surface of a printed circuit board at said end portion but protruding distal ends of said second leads are offset from the end portion of the printed circuit board;

vertically shifting said connector until said protruding distal ends of the first leads are brought into contact with terminals provided on said surface of the printed circuit board at said end portion while said second leads are spaced from the end portion of the printed circuit board; and advancing said connector toward said printed circuit board until said printed circuit board is clamped between said first and second leads.

10. The connector mounting method in accordance with claim 9, wherein said connector is held by said installation head in such a manner that said first leads are arranged horizontally and said second leads are arranged horizontally, while said first leads are spaced from said second leads in a vertical direction.

11. The connector mounting method in accordance with claim 9, wherein a clearance space between said first leads and said second leads corresponds to a thickness of said printed circuit board.

12. A method of automatically mounting a connector on an end of a printed circuit board comprising the steps of:

preparing a connector having first leads protruding forward from a front surface of a connector main body, and second leads shorter than said first leads and protruding forward from the front surface of said connector main body, said first leads being parallel to said second leads;

positioning said connector with holding means at a position where protruding distal ends of the first leads are brought into contact with a surface of a printed circuit board at an end portion, but protruding ends of the second leads are spaced from the printed circuit board;

deflecting said first leads to provide a clearance space between said first leads and said second leads for receiving said end portion of the printed circuit board; and advancing said connector with advancing means toward said printed circuit board until said printed circuit board is clamped between said first and second leads.

13. The connector mounting method in accordance with claim 12, wherein said connector is advanced from a side of said printed circuit.

14. The connector mounting method in accordance with claim 12, wherein said connector is shifted perpendicularly to said printed circuit board when said connector is positioned, while said connector is shifted parallel to said printed circuit board when said connector is advanced toward the printed circuit board.

15. A method of automatically mounting a connector on an end of a printed circuit board comprising the steps of:

preparing a connector having first leads protruding forward from a front surface of a connector main body, and second leads shorter than said first leads and protruding forward from the front surface of said connector main body, said first leads being parallel to said second leads;

shifting said connector in a holding means to a first predetermined position close to but spaced from a printed circuit board;

shifting said connector to a second predetermined position where a protruding distal end of the first lead is brought into contact with a surface of the printed circuit board at an end portion but a protruding end of the second lead is spaced from the printed circuit board, said protruding distal end of the first lead in said second predetermined position being deflected so as to increase a clearance space between said first leads and said second leads for receiving said end portion of the printed circuit board; and advancing said connector using advancing means toward said printed circuit board until said end of the printed circuit board is clamped between said first and second leads.

* * * * *